United States Patent
Wu et al.

(10) Patent No.: US 7,629,271 B1
(45) Date of Patent: Dec. 8, 2009

(54) HIGH STRESS DIAMOND LIKE CARBON FILM

(75) Inventors: Jing Wu, Sunnyvale, CA (US);
Anchuan Wang, San Jose, CA (US);
Robert T. Chen, Fremont, CA (US);
Young S. Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/233,881

(22) Filed: Sep. 19, 2008

(51) Int. Cl.
*H01L 21/31* (2006.01)
(52) U.S. Cl. .......... 438/778; 438/197; 257/E21.001
(58) Field of Classification Search .......... 438/778, 438/197, 758; 257/E21.001
See application file for complete search history.

(56) References Cited

U.S. PATENT DOCUMENTS

2007/0032024 A1* 2/2007 Peidous et al. .......... 438/299

OTHER PUBLICATIONS

Tan et al., "A High-Stress Liner Comprising Diamond-Like Carbon (DLC) for Strained p-Channel MOSFET," *IEEE Electron Device Letters*, 29:2, Feb. 2008.

* cited by examiner

*Primary Examiner*—Jack Chen
(74) *Attorney, Agent, or Firm*—Townsend and Townsend and Crew

(57) ABSTRACT

A method for forming a compressive film over a field effect transistor over a substrate is provided. The field effect transistor includes a channel region between a drain and a source within the substrate. The channel region is controlled by a gate electrode. The method includes depositing a diamond-like carbon (DLC) film over the field effect transistor to compress the channel region by generating a plasma of a processing gas including a precursor gas and an additive gas, wherein the precursor substantially includes only $C_2H_2$ and the additive gas includes Ar.

20 Claims, 2 Drawing Sheets

HIGH STRESS DIAMOND LIKE CARBON FILM

FIELD OF THE INVENTION

The present invention relates generally to methods for forming semiconductor structures. More particularly, the invention provides methods for forming a diamond-like carbon (DLC) film over a transistor.

BACKGROUND OF THE INVENTION

Strain engineering techniques have been studied in the field of semiconductor manufacturing. One application of the strain engineering techniques is for Complementary Metal-Oxide-Semiconductor (CMOS) technology including PMOS and NMOS transistors which respond differently to strains. Particularly, the strain engineering techniques can provide a compressive stress to a channel region of a PMOS transistor to strain the channel region. The strained channel of the PMOS transistor can enhance the mobility of hole carriers so as to improve the operational current of the PMOS transistor.

Conventionally, a silicon nitride ($Si_3N_4$) capping layer is formed over a PMOS transistor. The silicon nitride capping layer provides a compressive stress between about 2.4 GPa to of about 3.5 GPa. Due to its high compressive stress, the silicon nitride capping layer stains the channel of the PMOS transistor and enhances the mobility of hole carriers within the channel.

However, when the dimension of semiconductor technology has been shrinking, specially down to 32 nm or less, the compressive stress of the silicon nitride capping layer over the PMOS transistor declines and cannot desirably strain channels of PMOS transistors.

Accordingly, improvements to existing strain engineering techniques are desirable.

BRIEF SUMMARY OF THE INVENTION

Embodiments of the present invention pertain to methods that provide benefits over previously known processes and device structures by depositing a diamond-like carbon (DLC) film over a Metal-Oxide-Semiconductor Field Effect Transistor (MOSFET) to compress a channel region of the MOSFET having a channel length, such as 32 nm, 22 nm, or less. The DLC film can be formed from a processing gas including a precursor gas and an additive gas, wherein the precursor gas substantially includes only $C_2H_2$.

In one embodiment, a method for forming a compressive film over a field effect transistor over a substrate is provided. The field effect transistor includes a channel region between a drain and a source within the substrate. The channel region is controlled by a gate electrode. The method includes depositing a diamond-like carbon (DLC) film over the field effect transistor to compress the channel region by generating a plasma of a processing gas including a precursor gas and an additive gas, wherein the precursor substantially includes only $C_2H_2$ and the additive gas includes Ar.

In another embodiment, the method can further include before depositing the DLC film, heating up the substrate with a gas including hydrogen ($H_2$) to substantially form Si—H bonds.

In the other embodiment, the method can further include substantially immediately turning off the $C_2H_2/Ar$ plasma after depositing the DLC film.

These and other embodiments of the invention along with many of its advantages and features are described in more detail in conjunction with the text below and attached figures It should be understood, however, that the invention is not limited to the precise arrangements and instrumentalities shown.

BRIEF DESCRIPTION OF THE DRAWINGS

A further understanding of the nature and advantages of the present invention may be realized by reference to the remaining regions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Embodiments of the present invention relate to methods for depositing a diamond-like carbon (DLC) film over a P-type Metal-Oxide-Semiconductor Field Effect Transistor (P-MOSFET) to compress the channel region of the P-MOSFET. The DLC film may be formed from a processing gas including a precursor gas and an additive gas, wherein the precursor gas substantially includes only $C_2H_2$. The method may further include heating up the substrate with a gas including hydrogen ($H_2$) to substantially remove native oxide. In embodiments, the method may include substantially immediately turning off the $C_2H_2/Ar$ plasma.

Figure 1:
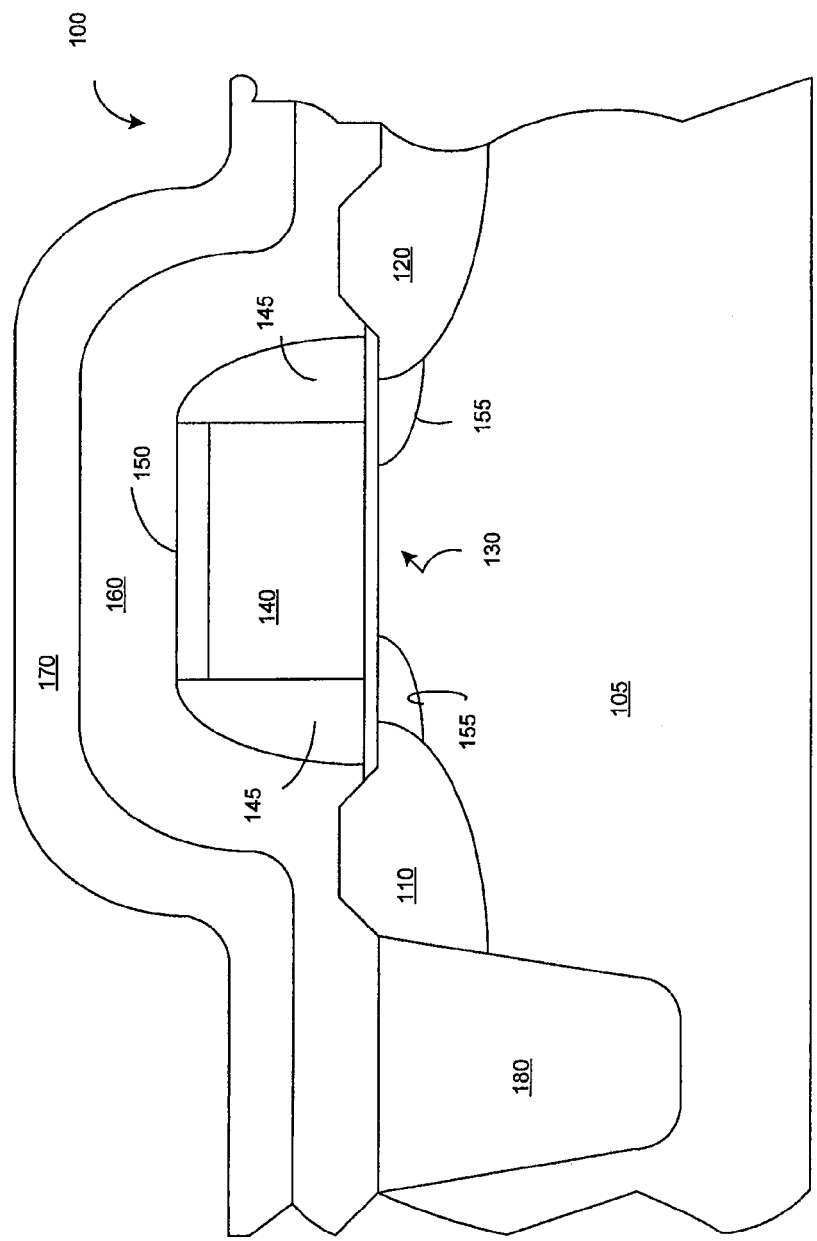
FIG. 1 is a schematic cross-sectional view of a compressive diamond-like carbon (DLC) film formed over a field effect transistor (FET) according to an embodiment of the present invention.

FIG. 1 is a schematic cross-sectional view of a compressive diamond-like carbon (DLC) film formed over a field effect transistor (FET) according to an embodiment of the present invention. As shown, a field effect transistor 100, such as a P-MOSFET, can include a channel region 130 between a drain 120 and a source 110 within a substrate 105, wherein the channel region 130 is controlled by a gate electrode 140. The substrate 105 can be any type of semiconductor substrates, such as silicon, silicon-germanium, III-V substrates, etc. The source 110 and drain 120 can be doped regions, such as n-type or p-type doped regions, epi-layer regions, such as SiGe epi-layer regions, or any combinations thereof. The channel region 130 can be a doped region, an epi-layer region, or have the same material characteristics as the substrate 105. The gate electrode 140 can be, for example, a silicon electrode, a metallic electrode, or any conductive electrode. Voltages applied to the gate electrode 140 can control the conductivity of the channel region 130.

In embodiments, a silicide 150 can be formed over the gate electrode 140. Dielectric spacers 145 can be formed on sidewalls of the gate electrode 140 as a mask layer for forming lightly-doped regions 155 within the substrate 105. Additionally, an isolation region 180, such as a shallow trench isolation (STI), can be formed adjacent to the source 110 to isolate the source from other active region within the substrate 105.

Referring to FIG. 1, a compressive diamond-like carbon (DLC) film 160 is formed over the transistor 100. The DLC film 160 can include sp2 (graphic-type) clusters and sp3 (diamond-type) clusters. The DLC film 160 can have a compressive stress of about 5GPa or more to desirably compress the channel region 130 to strain lattices of the channel region 130. The strained channel region 130 can provide a high hole mobility, such that when a gate voltage applied to the gate electrode 140 induces holes within the strained channel region 130, a hole current flowing from the source 110 to the drain 120 can be desirably increased. In embodiments, the DLC film 160 can have a compressive stress of about 6 GPa or more. The DLC film 160 can have hydrogen component (H) of about 30% by vol. or less. A sp3 fraction of the DLC film 160 can be of about 60% or more. A density of the DLC film 160 can be of about 2.2 g/cm$^3$ or more. The DLC film 160 can have a refractive index of about 2.26 or more and an absorption coefficient of about 0.1 or less. After the deposition of the DLC film 160, a dielectric layer 170, such as a pre-metal dielectric layer, can be formed over the DLC film 160.

Figure 2:
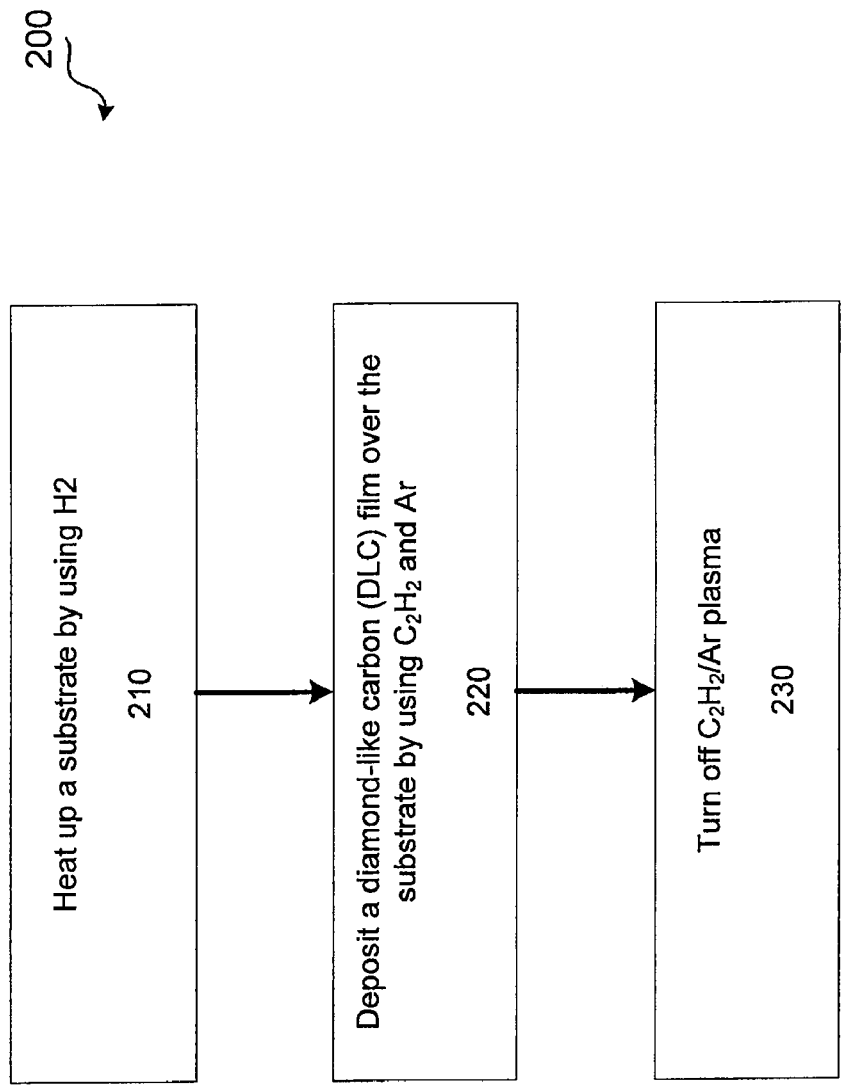
FIG. 2 shows a flowchart showing an exemplary method of forming the DLC film according to an embodiment of the present invention.

FIG. 2 shows a flowchart showing an exemplary method for forming a DLC film according to an embodiment of the present invention. A method 200 can include heating up the substrate 105 (shown in FIG. 1) by using H$_2$ (process 210); depositing a DLC film by using a processing gas including C$_2$H$_2$ and Ar (process 220); and turning of the C$_2$H$_2$/Ar plasma (process 230). The method 200 can be performed by a Chemical Vapor Deposition (CVD) system, such a high density plasma CVD (HDP CVD) system.

In the process 210, the substrate 105 can be heated up with hydrogen (H$_2$) to substantially remove native oxide over the substrate 105 and/or transistor 100 and form Si—H bonds thereon. Here, "substantially forming Si—H bonds" means that the amount of Si—H bonds can desirably provide for depositing the subsequent DLC film in process 220, such that the final DLC film can have a compressive stress of about 5 GaP or more. The process 210 can include an additive gas, such as Ar or other gas that is substantially free from interfering the removal of native oxide and/or the formation of Si—H bonds. In embodiments, the process 210 can be maintained at a temperature between about 300° C. and about 600° C. for between about 80 seconds and about 600 seconds. H$_2$ can have a flow rate between about 100 sccm and about 300 sccm. Ar can have a flow rate between about 150 sccm and about 300 sccm. The process 210 can have a source RF (SRF) power between about 5,000 Watt and about 15,000 Watt and a bias RF (BRF) power of about 0 Watt. In one embodiment, the process 210 can be maintained at a temperature between about 300° C. and about 600° C. from about 30 seconds to about 90 seconds. H$_2$ can have a flow rate of about 200 sccm. Ar can have a flow rate of about 200 sccm. The process 210 can have a source RF (SRF) power of about 8,500 Watt and a bias RF (BRF) power of about 0 Watt.

In the process 220, a DLC film is formed over the transistor 100 (shown in FIG. 1) by using a processing gas including a precursor gas and an additive gas. The precursor gas can include substantially only C$_2$H$_2$. Here, the phrase "the precursor gas includes substantially only C$_2$H$_2$" means that the amount of C$_2$H$_2$ in the precursor gas is substantial such that the compressive stress of the finally formed DLC film is of about 5 GPa or more. The additive gas can include, for example, Ar. For example, C$_2$H$_2$ and Ar can be ionized within a chamber of a HDP CVD system. The C$_2$H$_2$/Ar plasma is then used for depositing the DLC film over the transistor 100. In embodiments, the ratio of Ar to C$_2$H$_2$ can be of about 1.25:1 or more. The process 210 can be maintained at a temperature between about 100° C. and about 400° C. for about 60 seconds. The process 210 can be maintained at a pressure of about 1.5 mTorr or less. The process 210 can have a SRF power of about 1,500 Watt or less and a BRF power of about 300 Watt of less. In one embodiment, Ar can have a flow rate of about 70 sccm or higher and C$_2$H$_2$ has a flow rate of about 40 sccm or higher. In process 230, the C$_2$H$_2$/Ar plasma is turned off substantially immediately after the process 220. Here, "substantially immediately turning off the C$_2$H$_2$/Ar plasma after the process 220" means that no substantial post-deposition of DLC film is performed after the deposition of the DLC film formed by the process 220. The turn-off of the C$_2$H$_2$/Ar plasma substantially immediately after the process 220 can desirably achieve the compressive stress of the final DLC film 160, e.g., about 5 PGa or more, described above in conjunction with FIG. 1.

It is noted that the method 200 described above in conjunction with FIG. 2 is merely exemplary. The processes 210 and/or 230 can be saved if the final DLC film can provide a desired compressive stress to the MOS transistor.

Following is the description regarding forming DLC films from various precursor gases. It is found that the DLC film formed from the processing gas mainly including C$_2$H$_2$ and Ar in the process 220 has a compressive stress higher than that formed from a processing gas mainly including CH$_4$ and Ar. The C$_2$H$_2$/Ar DLC film can provide a compressive stress (about 5GPa or more) higher than that of the CH$_4$/Ar DLC film (about 2.4 GPa or less). When the channel length of a PMOS transistor is reduced, the C$_2$H$_2$/Ar DLC film can provide a high compressive stress to the channel of the PMOS transistor. Accordingly, the hole current flow of the PMOS transistor can be desirably enhanced.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method for forming a compressive film over a field effect transistor over a substrate, the field effect transistor including a channel region between a drain and a source within the substrate, the channel region being controlled by a gate electrode, the method comprising:
depositing a diamond-like carbon (DLC) film over the field effect transistor to compress the channel region by generating a plasma of a processing gas including a precursor gas and an additive gas, wherein the precursor substantially includes only $C_2H_2$ and the additive gas includes Ar.

2. The method of claim 1 wherein a ratio of Ar to $C_2H_2$ is about 1.25:1 or more.

3. The method of claim 2 wherein Ar has a flow rate of about 70 sccm or more and $C_2H_2$ has a flow rate of about 40 sccm or more.

4. The method of claim 1 wherein depositing the DLC film comprises maintaining a pressure of about 1.5 mTorr or less.

5. The method of claim 1 wherein the plasma is generated by applying a source RF (SRF) power of about 1,500 Watt or less and a bias RF (BRF) power of about 300 Watt or less.

6. The method of claim 1 wherein depositing the DLC film comprises maintaining a substrate temperature between about 100° C. and about 400° C.

7. The method of claim 1 wherein the DLC film has a hydrogen component of about 30% by vol. or less, a fraction of sp3 cluster of about 60% or more, and a density of about 2.2 g/cm³ or more.

8. The method of claim 1 wherein the DLC film has a compressive stress of about 5 GPa or more.

9. The method of claim 1 further comprising:
before depositing the DLC film, heating up the substrate with a gas including hydrogen ($H_2$) to substantially form Si—H bonds.

10. The method of claim 9 wherein a flow rate of $H_2$ is between about 100 sccm to about 300 sccm.

11. The method of claim 9 wherein the gas further includes Ar.

12. The method of claim 11 wherein a flow rate of Ar is between about 150 sccm to about 300 sccm.

13. The method of claim 9 wherein heating up the substrate includes maintaining a temperature between about 300° C. and about 600° C.

14. The method of claim 1 further comprising turning off the $C_2H_2$/Ar plasma substantially immediately after depositing the DLC film.

15. A method for forming a compressive film over a field effect transistor over a substrate, the field effect transistor including a channel region between a drain and a source within the substrate, the channel region being controlled by a gate electrode, the method comprising:
heating up the substrate with a gas including hydrogen ($H_2$) to substantially form Si—H bonds;
depositing a diamond-like carbon (DLC) film over the field effect transistor to compress the channel region by generating a plasma of a processing gas including a precursor gas and an additive gas, wherein the precursor substantially includes only $C_2H_2$ and the additive gas includes Ar, and a ratio of $C_2H_2$ to Ar is about 1.25:1 or more; and
turning off the $C_2H_2$/Ar plasma substantially immediately after depositing the DLC film.

16. The method of claim 15, wherein depositing the DLC film comprises maintaining a pressure of about 1.5 mTorr or less.

17. The method of claim 16, wherein Ar has a flow rate of about 70 sccm or more and $C_2H_2$ has a flow rate of about 40 sccm or more.

18. The method of claim 16, wherein the plasma is generated by applying a source RF (SRF) power of about 1,500 Watt or less and a bias RF (BRF) power of about 300 Watt or less.

19. The method of claim 16, wherein depositing the DLC film comprises maintaining a substrate temperature between about 100° C. and about 400° C.

20. The method of claim 16, wherein the DLC film has a hydrogen component of about 30% by vol. or less, a fraction of sp3 clusters of about 60% or more, and a density of about 2.2 g/cm³ or more.

* * * * *